United States Patent
Horesh et al.

(10) Patent No.: US 10,771,088 B1
(45) Date of Patent: Sep. 8, 2020

(54) OPTIMAL MULTI-DIMENSIONAL DATA COMPRESSION BY TENSOR-TENSOR DECOMPOSITIONS TENSOR

(71) Applicants: International Business Machines Corporation, Armonk, NY (US); Tufts University, Medford, MA (US); Tel Aviv-Yafo University, Tel Aviv-Jaffa (IL)

(72) Inventors: Lior Horesh, Yorktown Heights, NY (US); Misha E Kilmer, Medford, MA (US); Haim Avron, Tel Aviv (IL); Elizabeth Newman, Medford, MA (US)

(73) Assignees: INTERNATIONAL BUSINESS MACHINES CORPORATION, Armonk, NY (US); TUFTS UNIVERSITY, Medford, MA (US); TEL AVIV-YAFO UNIVERSITY, Tel Aviv-Jaffa (IL)

( * ) Notice: Subject to any disclaimer, the term of this patent is extended or adjusted under 35 U.S.C. 154(b) by 0 days.

(21) Appl. No.: 16/289,064

(22) Filed: Feb. 28, 2019

(51) Int. Cl.
| | |
|---|---|
| *H03M 7/00* | (2006.01) |
| *H03M 7/30* | (2006.01) |
| *G06F 16/174* | (2019.01) |
| *H03M 7/40* | (2006.01) |
| *G06F 17/16* | (2006.01) |
| *G06F 16/28* | (2019.01) |

(52) U.S. Cl.
CPC ...... *H03M 7/3062* (2013.01); *G06F 16/1744* (2019.01); *G06F 16/283* (2019.01); *G06F 17/16* (2013.01); *H03M 7/40* (2013.01)

(58) Field of Classification Search
CPC . G06T 1/20; G06T 2207/10024; G06T 5/005; H03M 7/30; H03M 7/3059; G06F 16/1744; G06F 16/283; G06F 17/16; G06F 17/18; G06F 17/30153; G06F 17/30592
USPC .................................. 341/51, 56, 76, 78
See application file for complete search history.

(56) References Cited

U.S. PATENT DOCUMENTS

| | | | |
|---|---|---|---|
| 5,204,899 A * | 4/1993 | Israelsen ................ G06T 9/008 341/200 |
| 9,681,147 B2 | 6/2017 | Mahfoodh et al. |
| 9,854,221 B2 | 12/2017 | Li et al. |
| 10,070,158 B2 | 9/2018 | Bourouihiya |
| 2014/0156231 A1* | 6/2014 | Guo ..................... G06F 17/18 703/2 |
| 2016/0232175 A1* | 8/2016 | Zhou ..................... G06T 1/20 |
| 2017/0316321 A1* | 11/2017 | Whitney ............ G06F 16/9574 |
| 2018/0173994 A1 | 6/2018 | Rippel et al. |

(Continued)

FOREIGN PATENT DOCUMENTS

WO    WO 2005/083890 A1    9/2005

OTHER PUBLICATIONS

Mel, et al. "The NIST Definition of Cloud Computing". Recommendations of the National Institute of Standards and Technology. Nov. 16, 2015.

(Continued)

*Primary Examiner* — Linh V Nguyen
(74) *Attorney, Agent, or Firm* — Athony R. Curro, Esq.; McGinn IP Law Group, PLLC

(57) ABSTRACT

A tensor decomposition method, system, and computer program product include compressing multi-dimensional data by truncated tensor-tensor decompositions.

20 Claims, 20 Drawing Sheets

(56) References Cited

U.S. PATENT DOCUMENTS

2018/0373981 A1* 12/2018 Hu ............................ G06N 3/08
2019/0158777 A1* 5/2019 Mann .................... G11B 27/031
2020/0042189 A1* 2/2020 Shao .................... G06F 12/0802

OTHER PUBLICATIONS

Christopher M. Bishop, "Pattern recognition and machine learning". 2006, Springer.
E Newman, M Kilmer, L Horesh, "Image classification using local tensor singular value decompositions", IEEE CAMSAP, Jun. 29, 2017.
E. Kernfeld, M. Kilmer, and S. Aeron, Tensor-tensor products with invertible linear transforms, LAA, (2015).
Ivanov, Mathies, "Vasilescu, Tensor subspace Analysis for Viewpoint Recognition", ICCV, 2009.
M. Kilmer and C. Martin, "Factorization strategies for third-order tensors", LAA, (2011).
N. Hao, L. Horesh, M. Kilmer, "Nonnegative tensor decomposition, Compressed Sensing & Sparse Filtering", Springer, 2014.
S. Soltani, M. Kilmer, and P. Hansen, "A Tensor-Based Dictionary Learning Approach to Tomographic Image Reconstruction", BIT, (2016).
Shi, Ling, Hu, Yuan, Xing, "Multi-target Tracking with Motion Context in Tensor Power Iteration", 2014—describes motion tracking approach for multiple targets.
Ballester-Ripoll et al., "TTHRESH: Tensor Compression for Multidimensional Visual Data", 2018 ARXIV.https://arxiv.org/pdf/1806.05952.

* cited by examiner

100

FIG. 2
- Notation: $\mathcal{A}^{n_1 \times n_2 \ldots \times n_N}$ - $N^{th}$ order tensor
  - ▲ $0^{th}$ order tensor - scalar 
  - ▲ $1^{st}$ order tensor - vector 
  - ▲ $2^{nd}$ order tensor - matrix 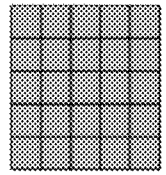
  - ▲ $3^{rd}$ order tensor ... 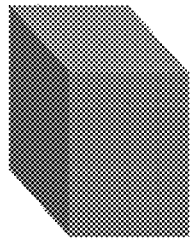

FIG. 3

Algorithm 1 Algorithm $\mathcal{A} *_M \mathcal{B}$ for invertible M from [?]

Define $\hat{\mathcal{A}} = \mathcal{A} \times_3 M$, $\hat{\mathcal{B}} = \mathcal{A} \times_3 M$,
for all $i = 1, \ldots, n$ do
  $\hat{e}_{:,:,i} = \hat{\mathcal{A}}_{:,:,i} \hat{\mathcal{B}}_{:,:,i}$
end for
Define $\mathcal{C} = \hat{\mathcal{C}} \times_3 M^{-1}$. Now $\mathcal{C} = \mathcal{A} *_M \mathcal{B}$.

FIG. 4

Algorithm 2 Full t-SVDM for $\mathcal{A}$ for given M a scalar multiple of a unitary matrix $\hat{\mathcal{A}} \leftarrow \mathcal{A} \times_M M$
for all $i = 1, \ldots, n$ : do
$\quad [\hat{\mathcal{U}}_{:,:,i}, \hat{\mathcal{S}}_{:,:,i}, \hat{\mathcal{V}}_{:,:,i}] = \text{svd}([\hat{\mathcal{A}}_{:,:,i}])$ % note: rank $\hat{\mathcal{A}}_{:,:,i}$ is $\rho_i$.
end for
$\mathcal{U} = \hat{\mathcal{U}} \times_3 M^{-1}, \mathcal{S} = \hat{\mathcal{S}} \times_3 M^{-1}, \mathcal{V} = \hat{\mathcal{V}} \times_3 M^{-1}.$

FIG. 5

Algorithm 3 Return t-SVDII under $*_M$, $\rho$ to meet energy constraint.

INPUT: $\mathcal{A}$, $M$ a multiple of unitary matrix; desired energy $\gamma \in (0, 1]$.
Compute t-SVDM of $\mathcal{A}$.
Concatinate all $(\widehat{S}_{j,j,i})^2$ for all $i,j$ into a vector $v$.
$v \leftarrow \text{sort}(v, \text{'descend'})$.
Let $w_k = \sum_{i=1}^k v_i$ be the vector of cumulative sums, $k = 1:\text{length}(v)$.
Find the first index $J$ such that $w_J / \|\widehat{S}\|_F^2 > \gamma$.
Determine the value, $\tau$, of the $\widehat{S}_{j,j,i}$ corresponding to this $J$.
for all $i = 1, \ldots, n$ do
  Set $\rho_i$ as number of singular values for $\widehat{\mathcal{A}}_{:,:,i}$ greater or equal to $\tau$.
  Keep only the $m \times \rho_i$ $\widehat{\mathcal{U}}_{:,1:\rho_i,i}$ and $\mathcal{G}_\rho := \widehat{S}_{1:\rho_i,1:\rho_i,i} \widehat{\mathcal{V}}_{:,1:\rho_i,i}^H$, $i = 1, \ldots, n$.
end for

FIG. 7

Algorithm 4 Multi-Sided, Single Sweep

INPUT: $\mathcal{A}$ of size $m \times p \times n$; truncation parameters $k \leq \min(m,p), q \leq \min(m,p)$.
INPUT: $n \times n$ $\mathbf{M}$ and $k \times k$ $\mathbf{B}$ that are multiples of unitary matrices.
OUTPUT: $q \times p \times k$ core $\mathcal{G}$, left singular tensors $\mathcal{U}_k$ of $m \times k \times n$ and $\mathcal{W}_q$ of size $k \times q \times m$ 1) Compute $\mathcal{A} \approx \mathcal{U}_k *_M \mathcal{S}_{k*M} \mathcal{V}_k^H$
2) Define $k \times p \times n$, $\mathcal{C} := \mathcal{U}_k^T *_M \mathcal{A} = \mathcal{S}_{k*M} \mathcal{V}_k^H$.
3) Find the $q$-term truncated t-SVD of the $n \times p \times k$ tensor $\mathcal{C}^P$ under $*_B$:

$$\mathcal{C}^P \approx \mathcal{W}_q *_B \mathcal{D}_q *_B \mathcal{Q}_q^H$$

4) Use this t-SVD to compress further with a $q$-term projection:

$$\mathcal{G} := \mathcal{W}_q^T *_B \mathcal{C}^P = \mathcal{D}_q *_B \mathcal{Q}_q^H.$$

FIG. 9

- INPUT: $\mathcal{A}$ of size $m \times p \times n$ ; truncation parameters $k, q$

- OUTPUT: $k \times t \times q$ core $\mathcal{G}$, left singular tensors $\mathcal{U}_k$ of size $m \times k \times n$ and $\mathcal{W}_q$ of size $k \times q \times m$ a. Compute $\mathcal{A} \approx \mathcal{U}_k *_M \mathcal{S}_k *_M \mathcal{V}_k^H$ b. Define $\mathcal{C} \equiv \mathcal{U}_k^\dagger *_M \mathcal{A} = \mathcal{S}_k *_M \mathcal{V}_k^H$ c. Find the $q$-term truncated t-SVD of $\mathcal{C}_{*_B}^P$ under $\mathcal{C}^P \approx \mathcal{W}_q *_B \mathcal{D}_q *_B \mathcal{Q}_q^T$ d. Use this t-SVD to compress further with a $q$-term projection: $\mathcal{G} := \mathcal{W}_q^T *_B \mathcal{C}^P = \mathcal{D}_q *_B \mathcal{Q}_q^T$

FIG. 10

---
Algorithm 5 Multi-sided, Double Sweep
---
INPUT: $m \times p \times n$ tensor, $\mathcal{A}$.
OUTPUT: two triples $(\mathcal{G}, \mathcal{U}_k, \mathcal{W}_q)$ and $(\tilde{\mathcal{G}}, \tilde{\mathcal{U}}_k, \tilde{\mathcal{W}}_q)$ that implicitly represent the approximation to $\mathcal{A}$.
Call Algorithm 1 with input $\mathcal{A}, k, q$ to return $(\mathcal{G}, \mathcal{U}_k, \mathcal{W}_q)$
Call Algorithm 1 with input $\mathcal{A}^P, k, q$ to return $(\tilde{\mathcal{G}}, \tilde{\mathcal{U}}_k, \tilde{\mathcal{W}}_q)$
Implicitly, approx is $\alpha \mathcal{A}_{k,q} + (1-\alpha)(\mathcal{A}^P)^P_{k,q}$
---

FIG. 11

- INPUT: $\mathcal{A}$ of size $m \times p \times n$ ; truncation parameters

- OUTPUT: two triples $\mathcal{G}, \mathcal{U}_k, \mathcal{W}_q$ and $\tilde{\mathcal{G}}, \tilde{\mathcal{U}}_k, \tilde{\mathcal{W}}_q$ that implicitly represent the approximation to $\mathcal{A}$ a. Assume for simplicity a 3rd degree tensor, $m \times p \times n$ tensor, $\mathcal{A}$, the output of the process is two triples $\mathcal{G}, \mathcal{U}_k, \mathcal{W}_q$ and $\tilde{\mathcal{G}}, \tilde{\mathcal{U}}_k, \tilde{\mathcal{W}}_q$ that implicitly represent the approximation to $\mathcal{A}$ b. Perform the multi-sided truncated decomposition process (embodiment 1) with input $\mathcal{A}, k, q$ to return $\mathcal{G}, \mathcal{U}_k, \mathcal{W}_q$ c. Perform the multi-sided truncated decomposition process (embodiment 1) with input with input $\mathcal{A}^\top, k, q$ to return $\tilde{\mathcal{G}}, \tilde{\mathcal{U}}_k, \tilde{\mathcal{W}}_q$ d. The storage for the implicit representation is $2kqt + 2mnk + (n+m)kq$

FIG. 12

- INPUT: $\mathcal{A}$ of size $m \times p \times n$ ; 2 multi-rank energy parameters $\rho, q$

- Retain only the pairs of matrices $\widehat{\mathcal{U}}_{:,1:\rho_i,i}$ and $\widehat{\mathcal{C}}_{1:\rho_i,:,i}$ for $i = 1, \ldots, n$

- In the context of the multi-sided tensor decomposition (embodiment 1), consider the explicitly zero-padding to obtain a $\widetilde{\mathcal{C}}$ that is $\rho \times p \times n$ , with $\rho = \max_i \rho_i$

- To perform step (c) of the multi-sided tensor decomposition (embodiment 1), compute a t-SVD, with invertible transform $M$ under $*_B$ applied to $(\widetilde{\mathcal{C}} \times_3 \vec{M}^{-1})^P$

- First, $\bar{\mathcal{C}} := \widetilde{\mathcal{C}} \times_3 M^{-1} = \mathrm{fold}\left((M^{-1} \otimes I)\mathrm{unfold}\left(\widetilde{\mathcal{C}}\right)\right)$

- To move $\bar{\mathcal{C}}^P$ into the transform domain by $B$ , we have $(\bar{\mathcal{C}}^P) \times_3 B = \mathrm{fold}\left((B \otimes I)P^\top(M^{-1} \otimes I)\mathrm{unfold}\left(\widetilde{\mathcal{C}}\right)\right)$ where $P$ is a stride permutation

FIG. 13

- As each face $\widehat{\mathcal{G}}_{:,:,i}$ is computed, its matrix SVD can be computed
- Individual matrix SVDs are independent, and therefore can be computed asynchronously
- Define $\widehat{\mathcal{G}} = \widehat{\mathcal{D}} \widehat{\mathcal{Q}}^H$
- From this step, we save only the $\widehat{\mathcal{W}}_{:,1:q_i,i}$ and $\widehat{\mathcal{G}}_{1:q_i,i,:}$
- The final output consists of $\widehat{\mathcal{U}}_{:,1:\rho_i,i}, i = 1 : n, \widehat{\mathcal{W}}_{:,1:q_i,i}$ and $\widehat{\mathcal{G}}_{1:q_i,i,:}$ for $i = 1..k$

FIG. 14

- A new piece of multi-dimensional data, $\vec{\mathcal{J}}$, is observed

- Determine the $i = 1 : n$ subvectors of coefficients of size $\rho_i : \widehat{\mathcal{U}}^H_{:,1:\rho_i,i} \vec{\widetilde{\mathcal{J}}}_{:,:,i}$

- Then pad each of these by $m - \rho_i$ zeros, stack the resulting length $m$ subvectors into a vector $m - \rho_i$, and compute $$\left( \text{fold} \left[ \widehat{\mathcal{W}}^H_{:,1:q_1,1} \cdots \widehat{\mathcal{W}}^H_{:,1:q_k,k} \right] (B \otimes I) P^\top (M^{-1} \otimes I) v \right)$$

- This coefficient tensor can be compared against entries in $\widehat{\mathcal{G}}_{1:q_i,i,:}$ to determine whether the test data resembles the training data

OPTIMAL MULTI-DIMENSIONAL DATA COMPRESSION BY TENSOR-TENSOR DECOMPOSITIONS TENSOR

BACKGROUND

The present invention relates generally to a tensor decomposition method, and more particularly, but not by way of limitation, to a system, method, and computer program product for optimal multi-dimensional data compression by tensor-tensor decompositions.

Most of real-world data is inherently multidimensional. Many operators and models are natively multi-way. The use of higher-order tensor representations (i.e., multi-way array representations) has become ubiquitous in science and engineering applications. It is often natural to store the data according to the variable labelling to which it relates (i.e., vertical, horizontal and depth dimensions might correspond to variables in two spatial dimensions and a time dimension). It has become clear that processing data in tensor format through the use of certain known decompositions relevant to the specific application can capture correlations or patterns in data that are not obvious when the data is treated in a matrix format.

Moreover, structural redundancies can be captured via tensor decompositions in ways that allow for better compression of data. However, first, such data needs to be presented in a tensor format in which this can be revealed. Consider, for example, a single vector $v \in \mathbb{R}^{mn}$ (i.e., a $1^{st}$ order tensor) which is actually the Kronecker product of two vectors, one of length n and one of length m. In order to reveal the two vectors in the Kronecker form, one needs to reshape the data to an m×n or n×m matrix (i.e., a $2^{nd}$ order tensor), and observe that it is a rank-one matrix. From the rank-1 matrix factors, one obtains a pair of vectors needed to form v. Thus, the implicit storage cost of v is only (m+n), rather than mn, a great savings if m and n are large.

SUMMARY

Thus, there has been identified a need in the art for a compression mechanism that honors the dimensional integrity of the data, prescriptively controls compression fidelity (as a trade-off with storage) preferably in a fine-grained manner, provides compression that can be (provably) optimal, provides efficient computation and in particular in parallel and distributed manner. Moreover, the inventors have identified a need in the art for a consistent, matrix-mimetic, multidimensional data compression framework, to facilitate improved storage reduction and computation efficiency. Also, there is a need for amendable for efficient hardware accelerated substrate. Indeed, not only is the tensor compressed representation elucidated in the invention is optimal by itself, but it is also provably superior to the matrix one.

In an exemplary embodiment, the present invention provides a computer-implemented tensor decomposition method, the method including compressing multi-dimensional data by truncated tensor-tensor decompositions.

One or more other exemplary embodiments include a computer program product and a system, based on the method described above.

Other details and embodiments of the invention will be described below, so that the present contribution to the art can be better appreciated. Nonetheless, the invention is not limited in its application to such details, phraseology, terminology, illustrations and/or arrangements set forth in the description or shown in the drawings. Rather, the invention is capable of embodiments in addition to those described and of being practiced and carried out in various ways and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Aspects of the invention will be better understood from the following detailed description of the exemplary embodiments of the invention with reference to the drawings, in which:

FIG. 2 exemplarily depicts tensor algebra notation used in explaining the invention according to an embodiment of the present invention;

FIG. 3 exemplarily depicts a first process according to an embodiment of the present invention;

FIG. 4 exemplarily depicts a second process according to an embodiment of the present invention;

FIG. 5 exemplarily depicts a third process according to an embodiment of the present invention;

FIG. 7 exemplarily depicts a fourth process according to an embodiment of the present invention;

FIG. 9 exemplarily depicts multi-sided tensor decomposition based compression according to a second embodiment of the present invention;

FIG. 10 exemplarily depicts a fifth process according to an embodiment of the present invention;

FIG. 11 exemplarily depicts multi-sided tensor decomposition based compression according to a third embodiment of the present invention;

FIG. 12 exemplarily depicts multi-sided tensor decomposition based compression according to a fourth embodiment of the present invention;

FIG. 13 exemplarily depicts multi-sided tensor decomposition based compression according to a fourth embodiment of the present invention;

FIG. 14 exemplarily depicts an example of multi-sided tensor decomposition based compression according to a fourth embodiment of the present invention;

DETAILED DESCRIPTION

Figure 1:
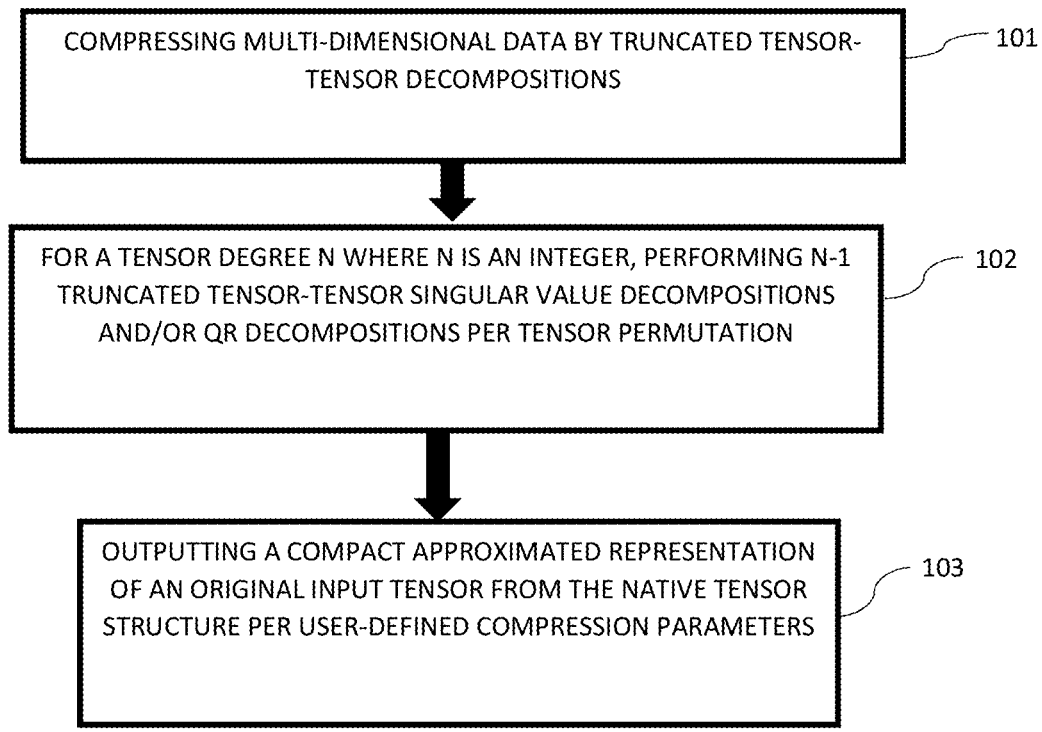
FIG. 1 exemplarily shows a high-level flow chart for a tensor decomposition method 100 according to an embodiment of the present invention.

The invention will now be described with reference to FIGS. 1-20, in which like reference numerals refer to like parts throughout. It is emphasized that, according to common practice, the various features of the drawings are not necessarily to scale. On the contrary, the dimensions of the various features can be arbitrarily expanded or reduced for clarity.

By way of introduction of the example depicted in FIG. 1, an embodiment of a tensor decomposition method 100 according to the present invention can include various steps for multi-dimensional data compression by truncated tensor-tensor decompositions.

Figure 18:
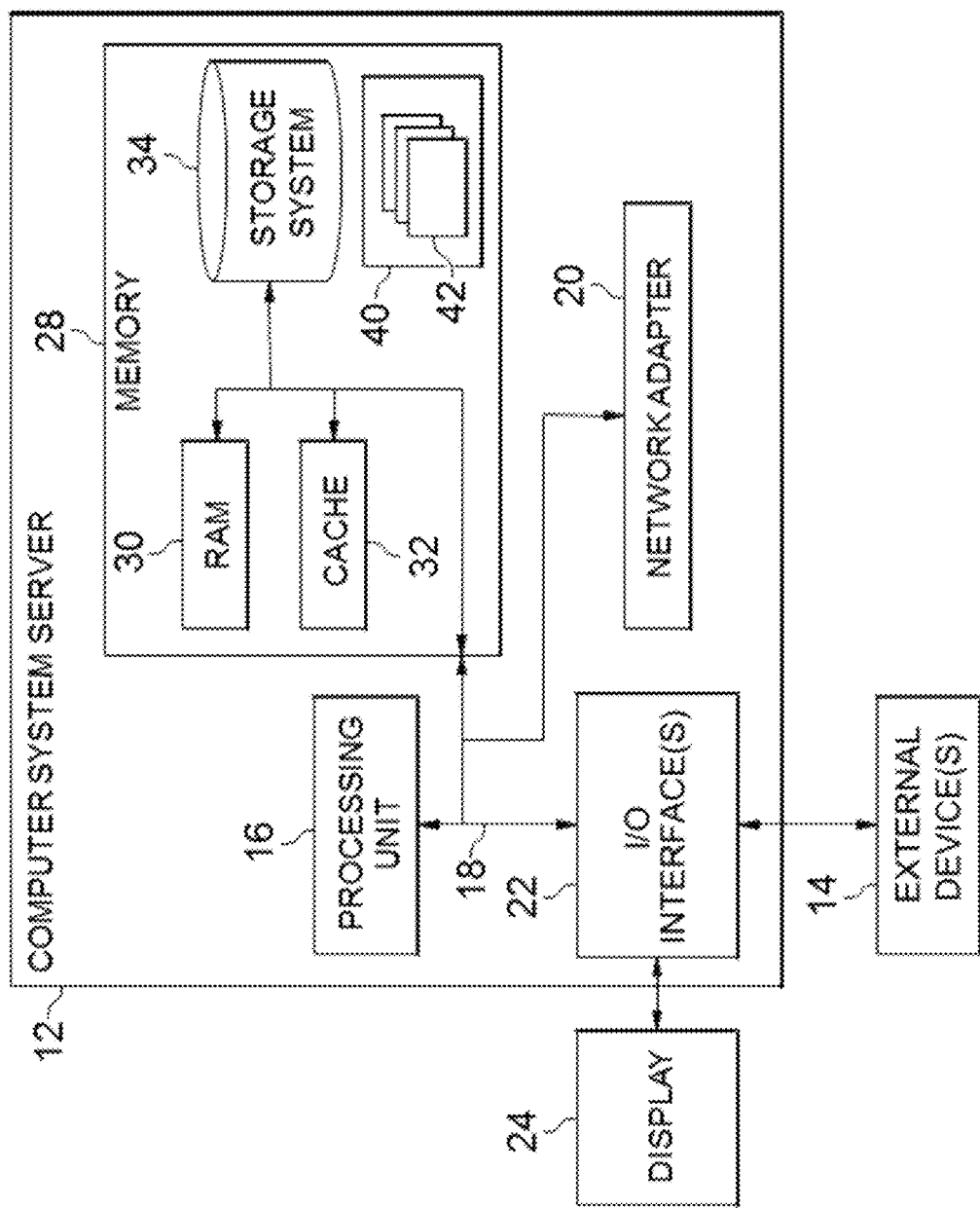
FIG. 18 depicts a cloud-computing node 10 according to an embodiment of the present invention.

By way of introduction of the example depicted in FIG. 18, one or more computers of a computer system 12 according to an embodiment of the present invention can include a memory 28 having instructions stored in a storage system to perform the steps of FIG. 1.

Although one or more embodiments may be implemented in a cloud environment 50 (e.g., FIG. 20), it is nonetheless understood that the present invention can be implemented outside of the cloud environment. Or, dedicated hardware would be another computational substrate realizing the concept.

As a preliminary matter, a tensor is a multi-dimensional array, and the order of the tensor is defined as the number of dimensions of this array. The notation discussed herein is limited to a third order case, and is generalized to higher order below. A third order tensor A is an object $\in \mathbb{R}^{m \times p \times n}$. We use MatLab notation for 84 entries: $A_{i,j,k}$ denotes the entry at row i and column i of the matrix going k "inward". 85 The fibers of tensor A are defined by fixing two indices. Of note are the tube fibers, 86 written as $A_{i,j,:}$ or $a_{i,j}$, i=1:m,j=1:p. A slice of a third order tensor A is a 87 two-dimensional array defined by fixing one index. Of particular note are the frontal 88 and lateral slices, as depicted in FIG. 1. The ith frontal slice is expressed as $A_{:,:,i}$ 89 and also referenced as $A^{(i)}$ for convenience in later definitions. The jth lateral slice 90 would be $A_{:,j,:}$ or equivalently expressed as $\vec{A}_j$.

One exemplary first closed multiplicative operation between a pair of third order tensors of appropriate dimension is named the t-product, and the resulting algebraic framework was defined. The block circulant matrix of size mn×pn generated from m×p×n $\mathcal{A}$ is $$circ(A) = \begin{pmatrix} A^{(1)} & A^{(n)} & A^{(n-1)} & \ldots & A^{(2)} \\ A^{(2)} & A^{(1)} & A^{(n)} & \ldots & A^{(3)} \\ \vdots & & & \ddots & \vdots \\ A^{(n)} & A^{(n-1)} & A^{(n-2)} & \ldots & A^{(1)} \end{pmatrix}.$$

The first mn×p block column of this matrix is also called unfold (A). The fold 97 operation is the inverse: fold (unfold(A))≡A. Now we can define the t-product:

Definition 1. Let B $\in \mathbb{R}^{l \times p \times n}$ and C $\in \mathbb{R}^{p \times m \times n}$. The t-product is 99 defined by A=B*C ≡fold(circ (B) unfold (C)), Consequently, e t at A is an $\ell$ ×m n tensor.

It is also highlighted that since it will help put the other tensor-tensor product definitions below into context, is the fact that the t-product, and factorizations based on t-products, are computed efficiently (and can be implemented to take advantage of parallelism) in the Fourier Transform (FT) domain. For example, the following steps can be used to compute the t-product in Matlab:

1. Move A, B into the Fourier domain, by taking FFTs along tube fibers:

$\hat{A}$=fft(A,[ ],3);$\hat{B}$=fft(B,[ ],3).

2. For i=1 . . . n, compute matrix matrix products, assign to $\hat{C}_{:,:,i}$:

$\hat{C}_{:,:,i} = \hat{A}_{:,:,i} \hat{B}_{:,:,i}$

3. C is obtained by inverse FFT's along tube fibers:

C=ifft($\hat{C}$,[ ],3);

Some other notation that one can use for convenience are the vec and reshape commands that map matrices to vectors by column unwrapping, and vice versa:

$a$=vec$(A)\in \mathbb{C}^{mn} \leftrightarrow A$=reshape$(a,[m,n])$. $\mathbb{C}^{mn}$ One can also define invertible mappings between m×n matrices and m×1×n tensors by twisting and squeezing X $\in \mathbb{C}^{m \times n}$ x is related to $\vec{X}$ via $\vec{X}$=twist(X) and $X$=sq$(\vec{X})$.

The notation A×$_3$F where A is m×p×n and F is r×m means multiplication of a matrix F along the mode-three slides of A—the result is an r×p×n tensor. This can be expressed using matrix-matrix products, leveraging our squeeze 122 notation. The mode-three unfolding of A, denoted $A_{(3)}$ is $$A_{(3)} := [sq(A_{:,1,:})^T, sq(A_{:,2,:})^T, \ldots, sq(A_{:,p,:})^T]. \tag{1}$$

Thus, A×$_3$F means one needs to compute the matrix-matrix product $FA_{(3)}$, which is 125 r×np, and then reshape the result to an r×p×n tensor. Thus, $\hat{A}$=A×$_3$F if F126 denotes the unnormalized DFT matrix. This interpretation is useful below when we 127 define our tensor-tensor products more generally.

For a class of tensor-tensor products of interest, let M be any invertible, n×n matrix, and $\Lambda \in \mathbb{C}^{m \times p \times n}$, One will use that notation to denote the tensor in the transform domain specified by M. That is, $\hat{A}$ is the result of applying M along all tube fibers. It would not be efficient to compute $\hat{A}$ by looping over the fibers and applying M to each tube fiber. Conventionally, it was observed that $\hat{A}$: =A×3 M. As noted above, this mode-3matrix product is computed by applying M to the left of $A_{(3)}$, which by (1) and the definition of matrix matrix product, is equivalent to computing the product block-by-block:

$$MA_{(3)} = [Msq(A_{:,1,:})^T, Msq(A_{:,2,:})^T, Msq(A_{:,p,:})^T], \tag{2}$$

and reshaping the result. Alternatively, it is readily shown that $\hat{A}$ can be computed by (3):

$$\text{fold}((M \oplus I)\text{unfold}(A)). \tag{3}$$

The different ways of thinking about the computation of moving the tensor into the transform domain are useful in the various exemplary proofs throughout this disclosure.

The $\star_M$ product between $A \in \mathbb{C}^{m \times p \times n}$ and B $\in \mathbb{C}^{p \times r \times n}$ can be defined through the steps in a first process as shown in FIG. 3.

It is noted that the similarity to the process above in the previous section for computing the t-product. Step 2 is highly parallelizable since the matrix-matrix products in the loop are independent. Step 1 (and 3) could in theory also be performed in p independent blocks of matrix-matrix products (or matrix solves, in the case of $\times_3 M^{-1}$).

Choosing M as the (unnormalized) DFT matrix and comparing to the algorithm in the previous section, one can see that $A \star_M B$ is the same as A*B. Thus, the t□product is a special instance of products from the $\star_M$ product family.

Definition 2 (identity tensor). The m×m×n identity tensor I satisfies $A \star_M I=166 A=I \star_M A$ for $A \in \mathbb{C}^{m \times m \times n}$. It should be clear from the definition in the previous section that this always exists: for example, given A, choose B such that each $\hat{B}_{:,:,i}$ is the m×m identity matrix. In the case of the t□product, I is the tensor whose first frontal slice is the m×m identity matrix, and whose other frontal slices are all zeros.

Definition 3 (conjugate transpose). Given $A \in \mathbb{C}^{m \times p \times n}$ its p×m×n conjugate transpose under $\star_M$ A H is defined such that $(\hat{A}^H)^{(t)}=(\hat{A}(t))^H$, i=1, ..., n.

This definition ensures the multiplication reversal property for the Hermitian transpose under $\star_M$: $A H_{\star_M}{}^B H=(R \star_M A)^H$. This definition is consistent with the t-product transpose given in past techniques when $\star_M$ is defined by the DFT matrix. With conjugate transpose and an identity operator defined, the concept of unitary and orthogonal tensors is now straightforward in the fourth definition of:

Definition 4 (unitary/orthogonality). $Q \in \mathbb{C}^{m \times m \times n}$ ($Q \in \mathbb{R}^{m \times m \times n}$) is called $\star_M$□unitary ($\star_M$□orthogonal) if $$Q^H \star_M Q = I = Q \star_M Q^H,$$

where H is replaced by transpose for real tensors. Note that I must be the one defined under $\star_M$ as well.

In the special case of the t-product, $Q_{:,i,:}{}^{T}*Q_{:,j,:}$ yields a tube fiber full of zeros when i≠j but equals the (1,1) tube fiber (i.e. the first canonical unit vector oriented into the board) of $\mathcal{I}$ ID when i=j. The invention focuses on products such that Q is not just $\star_M$-unitary, but also when the $\star_M$ product with the $\star_M$-unitary tensor preserves the Frobenius norm of $\|Q \star_M A\|_F = \|A\|_F$.

This invariance was shown elsewhere to hold for the t-product. Here, in theorem 5, this is considered more generally:

Theorem 5. With the choice of M=cW for unitary (orthogonal) W, and non□zero c, assume Q is $\star_M$□unitary ($\star_M$□orthogonal). Then $\|Q \star_M B\|_F = \|B\|_F$. Likewise for appropriate tensor dimensions, $\|B \star_M Q\|_F = \|B\|_F$.

Proof Suppose M=cW where W is a unitary matrix. Then $M^{-1}=1/c W^H$.

First, $$\|\hat{B}\|_F = \|B *_M M\|_F = \|cWB_{(3)}\|_F = c\|B_{(3)}\|_F = c\|B\|_F. \quad (4)$$

Let $C = Q *_M B$. Using (4), $$\|B\|_F^2 = \frac{1}{|c|^2}\|\hat{B}\|_F^2 = \frac{1}{|c|^2}\sum_{i=1}^{p}\left\|\hat{Q}_{:,:,i}\hat{B}_{:,:,i}\right\|_F^2 = \frac{1}{|c|^2}\|\hat{C}\|_F^2 = \|C\|_F^2 = \|Q *_M B\|_F^2,$$

Thereby, since each $\hat{Q}_{:,:,i}$ must be unitary matrices. The other directional proof follows.

Based on the above, the framework needed to describe tensor SVDs induced by a fixed $\star$M operator.

As a sixth definition:

Definition 6. Let A be a m×p×n tensor. The (full) $\star_M$ tensor SVD (t□SVDM) of A is $$A = U *_M S *_M V^T = \sum_{i=1}^{min(m,p)} U_{:,i,:} *_M S_{i,i,:} *_M V_{:,i,:}^H \quad (5)$$

where $U \in \mathbb{R}^{m \times m \times n}$, $V \in \mathbb{R}^{p \times p \times n}$ are $\star_M$-unitary, and $S \in \mathbb{R}^{m \times p \times n}$ is a tensor whose frontal slices are diagonal such a tensor is called □diagonal). When M is the DFT matrix, this reduces to the t□product□based t□SVD.

Clearly, if m>p, from the second equation one can get a reduced t-SVDM, by restricting $\mathcal{U}$ to have only p orthonormal columns, and $\mathcal{S}$ to be p×p×n, as opposed to the full. Similarly, if p>m, one needs only keep the m×m×n portion of $\mathcal{S}$ and the m columns of $\mathcal{S}$ to obtain the same representation.

Independent of the choice of M, the components of the t-SVDM are computed in transform space. This is described as the full t-SVDM in the process of FIG. 4.

Above, it was shown that for M a multiple of a unitary matrix, $\star_M$ products with $\star_M$ unitary matrices preserve the Frobenius norm. Based on this, one has the following new result in which it is assumed M=cW, where c≠0, and W is unitary. Then given the t-SVDM of $\mathcal{A}$ over $\star_M$:

$$\|A\|_F^2 = \|S\|_F^2 = \sum_{i=1}^{min(p,m)} \|S_{i,i,:}\|_F^2.$$

Moreover, $\|S_{1,1,:}\|_F^2 \geq \|S_{2,2,:}\|_F^2 \geq \ldots$

Proof. The proof of the first equality follows directly from the theory in the previous subsection, the 2nd from the definition of Frobenius norm. To prove the ordering property, use the short hand for each singular tube fiber as $s_i := S_{i,i,:}$, and note using (4) that $$\|s_i\|_F^2 = \frac{1}{c}\left\|\begin{array}{c}\text{Reject}\\ s_i\end{array}\right\|_F^2 = \frac{1}{c}\sum_{i=1}^{n}\left(\text{Rejects}_i^{(j)}\right)^2.$$

However since $\hat{s}^{(j)} \geq \hat{s}_{i+1}^{(j)}$, the result follows.

This decomposition and observation give rise to definition 8 in which:

Definition 8. One refer to r in the t□SVDM definition 6 as the t□rank, the number of non□zero singular tubes in the t□SVDM. Note the t□rank depends on $\star_M$, so can vary with the decomposition.

One can also extend the idea of multi-rank in prior techniques to the $\star_M$ general case as in definition 9 in which:

Definition 9. The multi□rank of A under $\star_{M,\Lambda}$ is the vector p such that its ith entry $\rho_i$ denotes the rank of the ith frontal slice of A. Notice that a tensor with multi□rank ρ must have t□rank equal to $max_{i-1}, \ldots, {}_n\rho_i$.

One aspect that has made the t-product-based t-SVD so useful in many applications is the tensor Eckart-Young theorem for real valued tensors under the t-product. In loose terms, truncating the t-product based t-SVD gives an optimal approximation in the Frobenius norm. A proof (i.e., proof below of theorems 10 and 11) is given now for the special case that is considered in which M is a multiple of a unitary matrix.

Theorem 10. Define $A_k = U_{:,1:k,:} \star_M S_{1:k,1:k,:} \star_M V_{:,1:k,:}^H$, where M is a multiple of a unitary matrix. Then $A_k$ is the best Frobenius norm approximation over the set $\Gamma = \{C = X \star_M Y | X \in \mathbb{C}^{m \times k \times n}, Y \in \mathbb{C}^{k \times p \times n}\}$, the set of all t☐rank k tensors under $\star_M$, of the same dimensions as A. The squared error is $\|A-A_k\|_F^2 = \Sigma \|s_i\|_F^2$, where r is the t☐rank of A.

Proof. The squared error result follows easily from the results in the previous section. Now let $B = X \star_M Y$. $\|A-B\|_F^2 = 1/c \|\hat{A}-\hat{B}\|_F^2 = 1/c \Sigma \|\hat{A}_{:,:,i} - \hat{B}_{:,:,i}\|_F^2$. By 251 definition, $\hat{B}_{:,:,i}$ is a rank☐k outerproduct $\hat{X}_{:,:,i} \hat{Y}_{:,:,i}$. The best rank☐k approximation to $\hat{B}_{:,:,i}$ is $\hat{U}_{:,1:k, i}$ $_{1:k,1:k,i} \hat{S} \hat{V}_{:,1:k,i}^H$, so $\|\hat{A}_{:,:,i} \hat{U}_{:,1:k, i}$ $_{1:k:1:k,i} \hat{S} \hat{V}_{:,1:k,i}\|_F^2 \|\hat{A}_{:,:,i} \hat{V}_{:,:,i}\|_F^2 \square$ and the result follows.

Theorem 11. Given the t☐SVDM under $\star_M$, define $A_\rho$, to be the approximation having multi☐rank ρ: that is, Then $A_\rho$ is the best multi☐rank ρ approximation.

The invention uses the above by generalizing the idea of the t-SVDII to the $\star_M$ product when M is a multiple of a unitary matrix. The Process 3 shown in FIG. 5 provides a method for determining a realistic choice for ρ, in order to determine the multi-rank. The storage efficiency is achieved in practice by maintaining all relevant terms in the transform space.

Figure 6:
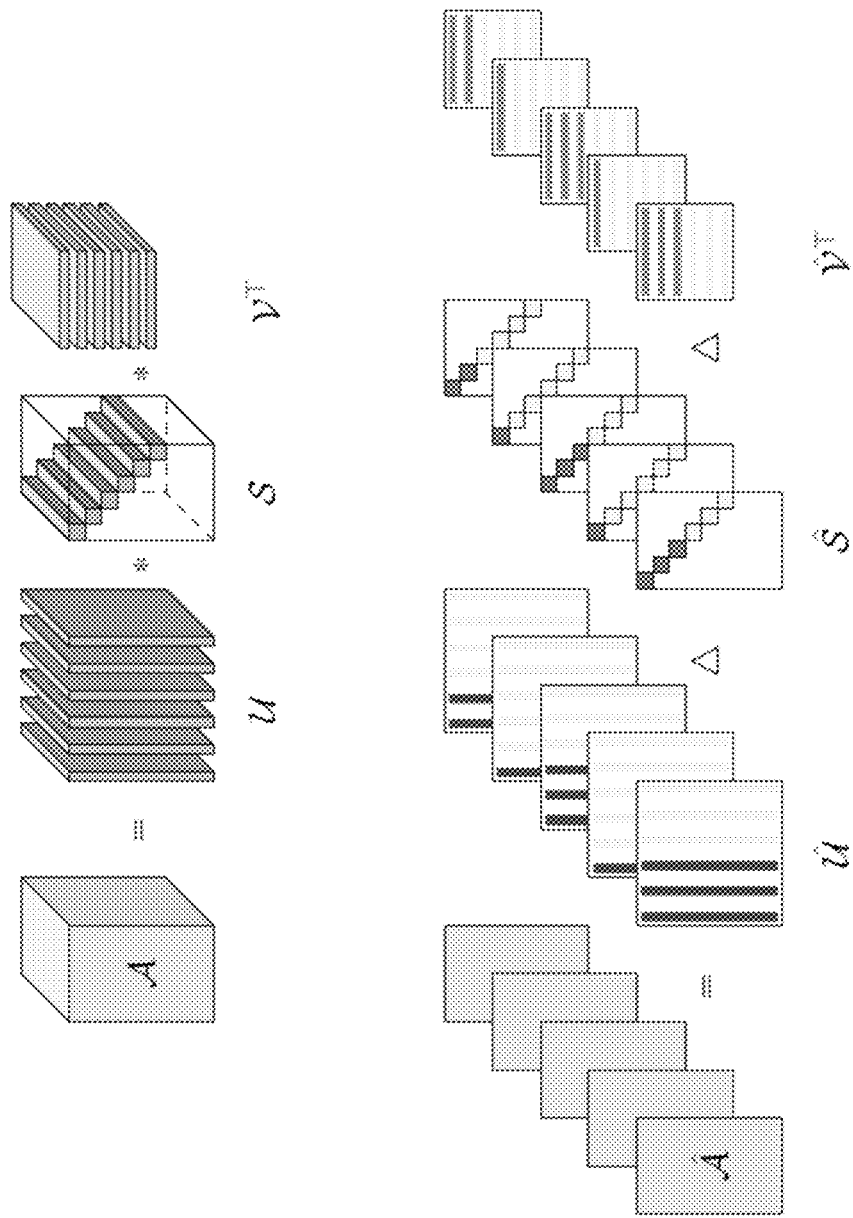
FIG. 6 exemplarily depicts different truncations across the different SVDs of the faces based on the third process according to an embodiment of the present invention.

The output of Process 3 is illustrated in FIG. 6 indicating that different frontal faces of the tensor can be truncated differently. Later, comparison of the inventive Eckart-Young results is discussed for tensors with the corresponding matrix approximations. But first, it is shown via a few results what structure these tensor approximations inherits from M.

Indeed, a lateral-slice-wise view on the t-product is shown via lemma 12:

Lemma 12 If B is m×p×n and C is p×k×n, and A=B*C, then $$\vec{A}_{:,j,:} = \vec{A}_j \sum_{i=1}^{p} B_{:,i,:} Reject C_{i,j,:} \longleftrightarrow sq(\vec{A}_j) = \sum_{i=1}^{p} B_i circ(C_{i,j,:}^T),$$

where $B_i := sq(B_{:,i,:})$ and $sq(\vec{A}_j)$ is $m \times n$.

There is a powerful consequence of post multiplication by circulant matrices. Given a tube fiber c with entries $c^{(1)} \ldots c^{(n)}$, $Bcirc(c) = c^{(1)}B + c^{(2)}BZ + c^{(3)}BZ^2 + \ldots c^{(n)}BZ^{n-1}$, where Z denotes the circulant downshift matrix that generates the cyclic group. This single matrix-matrix product is equivalent to generating a linear combination of column shifted versions of B. This suggests why the lemma is powerful—the structure induced by the algebra provides a mechanism for significant information content.

For general, $\star_M$, it is also shown that there is inherited matrix structure. Since, $\mathbb{C}^{1 \times 1 \times n}$ is isomorphic to $\mathbb{C}^n$, the invention uses bold for tube fibers and vectors interchangeably, the usage will be clear from the context. First, the invention analyzes what the product of a lateral slice with a tube fiber looks like. If v, c are two length-n tube fibers, it is easy to show that $v *_M c$ can be computed in (6):

$$\text{twist}((M^{-1}\text{diag}(Msq(c)^T))Msq(v)^T)^T. \quad (6)$$

$$\text{Let } \vec{B} = \text{twist}(B) = \begin{Bmatrix} b_1^T \\ b_2^T \\ \vdots \\ b_m^T \end{Bmatrix}.$$

With the above, and since $\vec{Q} := \vec{B} \star_M c$ is just the product of the tubes $\vec{B}_{i,1,:} \star_M c$. It follows from (6) that (7) $sq(\vec{Q}) = BMT\text{diag}(\hat{c})M^{-T}$. The matrix on the right is part of the matrix algebra $\{X : X = M^T D M^{-T}\}$, where D is a diagonal matrix. In the special case that M is the unnormalized DFT matrix and the diagonal of D is conjugate symmetric, observe that X would be a real, circulant matrix (giving exactly the t☐product case for real tensors, above). This brings us to a major result.

Theorem 13. Suppose that $$A = U *_M S *_M V^H \hat{c} = \sum_{i=1}^{t} U_{:,i,:} *_M C_{i,:,:}.$$

Then one has (8) in which:

$$sq\left(A_{:,k,:} - \sum_{i=1}^{t} sq(U_{:,i,:}) R[C_{i,k,:}], -\sum_{i=1}^{t} U_i R[C_{i,k,:}]\right), \quad (8)$$

where $R[v] := MT\text{diag}(\hat{v})M^{-T}$ maps a tube fiber to a matrix in the matrix algebra.

Thus, each lateral slice of A is a weighted combination of "basis" matrices given by $U := sq(U_{:,i,:})$, but the weights, instead of being scalars, are matrices $R[C_{i,k,:}]$ from a matrix algebra.

It is assumed that the data is a collection of 1×m×n matrices $D_i$, i=1, . . . 1 •. For example, $D_i$ might be a gray scale image, or it might be the values of a function discretized on a 2D uniform grid. Let $d_i = \text{vec}(D_i)$, so that $d_i$ has length mn. In matrix form:

$A = [d_1, \ldots d_l] \in \mathbb{C}^{mn \times p}$.

The above matrix form is consistent with this approach, and tensor via lateral slices is filled from left to right as:

$\mathcal{A} = [\text{twist}(D_i), \ldots, \text{twist}(Dp)] \in \mathbb{C}^{m \times \ell \times n}$.

And, it is observed that:

$$A \equiv \text{unfold}(\mathcal{A}) \in \mathbb{C}^{mn \times \ell} = \begin{Bmatrix} A^{(1)} \\ \vdots \\ A^{(n)} \end{Bmatrix} A^{(i)} \in \mathbb{C}^{m \times \ell}.$$

Thus, A and $\mathcal{A}$ represent the same data, just in different formats.

It is first instructive to consider in what ways the t-rank, t, of $\mathcal{A}$ and the matrix rank r of A are related. Then it is shown that relating the optimal t-rank k approximation of $\mathcal{A}$ with the optimal rank-k approximation to A as in theorem 14:

Theorem 14. Assuming mn≥l, the t☐rank t of A is less than or equal to the rank, r, of A. In particular, if m<r, then t<r.

Proof. The problem dimensions require that t min (m,l) and r l. Thus, if m<l=r, the conclusion holds right away.

Because of the above and (3), it holds true that:

$$\hat{A}_{:,:,i} = \hat{A}^{(t)} = \sum_{i=1}^{m} \mu_{ij} A^{(i)}. \quad (9)$$

Then the singular values of each $\hat{A}^{(i)}$, $\hat{s}_1^{(i)} \geq \ldots \hat{s}^{(i)}$, where rank of $\hat{A}^{(i)}$ is $\rho_i$, and $\rho_i$ min (m, l). Finally, $\hat{S}_{j,j,:} = s_i^{(i)}$ Reject, and so $S_{j,j,:} = \hat{S}_{j,j,:} \times 3M^{-1}$. When A has rank r<l, the rank of $\hat{A}^{(i)}$ cannot exceed r. This is because if A is rank r, we must be able to factor it as $A = GH^T$ with $H^T$ having only r<p rows. Thus, each $A^{(i)} = G_{(i-1)m+i m,:} H^T$, and it follows easily from (9) that $\rho_i$ min (m, r). Hence, S has at most r tubes that are filled with non zeros.

Note that the proof was independent of our choice of M as a multiple of a unitary matrix. In particular, it holds for M=I. To make the idea concrete, we give two examples.

Example 15. Let $D_1 = \begin{Bmatrix} 1 & 2 \\ 1 & 2 \end{Bmatrix}$ and $D_2 = \begin{Bmatrix} 3 & 0 \\ 3 & 0 \end{Bmatrix}$. So $$A = [vec(D_1), vec(D_2)] = \begin{bmatrix} 1 \\ 2 \end{bmatrix} 21 \ 0033 = \begin{Bmatrix} A^{(1)} \\ A^{(2)} \end{Bmatrix}$$

It is easy to see that A has full column rank. However, since the blocks $A^{(1)}$, $A^{(2)}$ are rank 1 and they each have the same range, it is easy to see that $\hat{A}^{(1)}$ and $\hat{A}^{(2)}$ each admit only one non☐zero singular value. Thus there is only one non☐zero singular tube, and therefore the t☐rank of A constructed in this way is one.

In this next example, one uses the specific case of the t-product and relation to circulant matrices given in the previous section to show that if the data has the structure induced by the choice of M, the matrix-based approximation cannot necessarily capture that, and could in fact require far more storage than the tensor representation.

Indeed, this is shown in example 16 in which:

Example 16

Let A denote an n×p×n tensor such that each of the p lateral slices is the twist of a matrix☐matrix product of the form Ucirc $(c_i)$ where the left matrix U is n×n and the right is a circulant matrix generated by the vector (equivalently, tube fiber) $c_i$. Assume the $c_i$, i=1, ..., p form an independent set in $\mathbb{R}^n$. Is is easy to see that the t☐rank is 1.

It is straightforward to show that $$A = (I \oplus U) \text{diag}(I, Z, \ldots, Z^{n-1})[_{c_1}{}^{c_1}C, \bullet 1 \ c_2 c_2 c_2 c_p c_p]$$

The rank of the A therefore is p. Indeed, A can be highly incompressible: for example, if U and C are orthogonal n×n, then we can show $\|A - A_k\|_F = n - k$.

For comparison of optimal approximations, one would need to compare the quality of approximations obtained by truncating the matrix SVD of the data matrix vs. truncating the t-SVD of the same data as a tensor. In what follows, it is again assumed that mn>1 and that A has rank r≤l.

Let $A = U\Sigma V^T$ be the matrix SVD of A, and denote its best rank☐k, k<r364 approximation according to $$C = \sum V^T, A_k := U_{:,i:k} \ C_{1:k,:} \Rightarrow (A_k)_{:,j} = \sum_{i=1}^{k} U_{:,i} c_{ij}. \quad (10)$$

$$\text{reshape}(A_k(:,j), [m,n]) = \sum_{i=1}^{k} \text{reshape}(U(:,i), [m,n]) c_{ij}, \quad (11)$$

$$j = 1, \ldots, k.$$

And, one needs the following matrix version of 10 which is reference in the proof below:

Theorem 17. Given A, A as defined above, with A having rank r and A having t☐rank t, let $A_k$ denote the best rank☐k matrix approximation to A in the Frobenius norm, where k r and $A_k$. Denote the best t☐rank☐k tensor approximation under $\star_M$, where M is a multiple of a unitary matrix, to A in the Frobenius norm. Then $$\|S_{k+1:r,k+1:r}, :\|_F = \|A \ A_k\|_F \|A - A_k\|_F = \sqrt{\sum_{i=k+1}^{r} \sigma_i^2}.$$

Proof. Consider (11). The multiplication by the scalar $c_{ij}$ in the sum is equivalent to multiplication from the right by $c_{ij}$ I. However, since M=cW for unitary W, one has $c_{ij} I = MT \text{diag}(c_{ij} e) M^{-T}$, where e is the vector of all ones. Define the tube fiber $C_{i,j,:}$ from the matrix C vector product $c_{ij} M^{-1} e$ oriented into the 3rd dimension. Then, $c_{ij} I = R[C_{i,j,:}]$. Now we observe that (11) can be equivalently expressed as $$\text{reshape}((A_k)_{:,j}) = \sum_{i=1}^{k} \text{reshape}(U_{:,i}) R[c_{ij}], \ i = 1, \ldots, k. \quad (12)$$

These can be combined into a tensor equivalent $$Z_k := \sum_{i=1}^{k} Q_{:,i,:M} * C_{i,:,:} = Q \text{Reject} C \text{ where}$$

$(Z_k)_{:,j,:}$=twist(reshape $((A_k)_{:,j}, [m, n])$), $Q_{:,i,:}$=twist (reshape $(U_{:,i}, [m, n])$). Since $\hat{C}_{:,:,i} = \Sigma_{1:k,1:k} V_{:,1:k}{}^T$, the t☐rank of C is k. The t☐rank of Q must also not be 384 smaller than k, by Theorem 14.

Thus, given the definition of $A_k$ as the minimizer over all such k☐term (outer 386 products' under $\star_M$, it follows that $$\|S_{k+1:r,k+1:r,:}\|_F = \|A - A_k\|_F \|A - Z_k\|_F = \|A - A_k\|_F.$$

Also, one needs to show that strict inequality is possible via examples and in real data situations. Here is one example, where one has used M as the unnormalized DFT matrix (i.e., the t-product).

Example 18

Let $$A = \begin{Bmatrix} 1 & 1 \\ 1 & 4 \\ 0 & 0 \\ 0 & -3 \end{Bmatrix} = \begin{Bmatrix} A^{(1)} \\ A^{(2)} \end{Bmatrix}.$$

(Define the optimal rank☐1 approximation to A as $A_1 = \sigma_1 u_1 v_1^T$. It is easily checked that $\|A - A_1\|_F = \sqrt{\sigma_2} = 1$. It is easy to show $$\hat{A}_{:,:,1} - \begin{Bmatrix} 1 & 1 \\ 1 & 1 \end{Bmatrix} - \hat{\sigma}_1^{(1)} \hat{u}_1^{(1)} (\hat{v}_1^{(1)})^T,$$

-continued $$\hat{A}_{:,:,2} = \left\{ \begin{matrix} 1 & 1 \\ 1 & 7 \end{matrix} \right\} = \hat{\sigma}_1^{(2)} \hat{u}_1^{(2)} (\hat{v}_1^{(2)})^T, |\hat{\sigma}_2^{(2)} \hat{u}_2^{(2)} (v_2^{(2)})^T,$$

with $\hat{\sigma}_2^{(2)} \neq 0$. Setting $A_1 = U_{:,1,:} * S_{1,1,:} RejectV_{:,i,:}^T$, then $$\|A - A_1\|_F = \|s_{2,2,:}\|_F = \left\| F^H \left\{ \begin{matrix} 0 \\ \hat{\sigma}_2^{(2)} \end{matrix} \right\} \right\|_F = \frac{1}{\sqrt{2}} \hat{\sigma}_2(2)$$

where F denotes the DFT matrix. Since the latter is about 0.59236, $$\|A\ A_1\|_F < 400 \|A\ A_1\|_F = 1.$$

For storage comparisons, it is assumed that K is the truncation parameter for the tensor approximation and k is the truncation parameter for the matrix approximation. The table 1 gives a comparison of storage:

TABLE 1

| Storage for basis $U_k$ | Storage for $C = S_k V_k^H$ | total implicit storage $A_k$ |
|---|---|---|
| mnk | kp | k(mn + p) |
| Storage for basis $U_K$ | Storage for $C = S_K *_M V_K^H$ | total implicit storage $A_K$ |
| mnκ | κpn | mnκ + κpn |

If K=k, one knows that the tensor approximation in error is at least as good, and often better, than the corresponding matrix approximation. Suppose the application is something like classification, in which case we only need to store the basis terms to represent the class. This means that often the basis for the tensor approximation is better in a relative error sense for the same storage. However, unless n=1 (the matrix and tensor are the same) it will always be the case that if we need to store both the basis and the coefficients, when K=k, we will need more storage for the tensor case.

In practice, one often observe that the relative error for the tensor case is smaller even with is κ<k (i.e. better than the theorem predicts). In fact, in a previous example, we showed the error is zero for κ=1, but k had to be p much larger to achieve exact approximation. If κ<m+n, then we also get k m+p that the total implicit storage of the tensor approximation is less than the total for the matrix case.

The t-SVDMII approach offers the ability for more compression, provided that one stores the components in transform space only, and provided the choice of M is a good one given the latent structure in the data. The storage information is in Table 2.

TABLE 2

| Storage for $\hat{U}_\rho$ | Storage for $\hat{C}_\rho$ | total implicit storage |
|---|---|---|
| $m\Sigma_{i=1}^n \rho_i$ | $\Sigma_{i=1}^n \rho_i p$ | $(m + p)\Sigma_{i=1}^n \rho_i$ |

In many cases, it is found that $$\sum_{i=1}^n \rho_i \ll rn,$$

so that for the same relative error, one will have considerably less storage than the matrix case or than the t-SVDM with a single truncation. The reason for this is the ability, for an appropriate choice of M, to capture latent structure in the data as outlined above. Another way of explaining this phenomenon is to consider the action of M on each tube fiber. Since M is a linear transformation (i.e. invokes a change of variables) $\hat{A}_{:,:,i}$ for each i will correspond to a different feature. For example, frontal face i corresponds to a particular frequency if M is a DFT or DCT matrix. The t-SVDMII approach allows the invention to emphasize the more important features (e.g. low frequencies), and take a larger truncation on the corresponding frontal faces because those features contribute more to the global approximation. Truncation of t-SVDM by a single truncation index, on the other hand, effectively treats all features equally, and always truncates each $\hat{A}_{:,:,i}$ to k terms, which depending on the choice of M may not be as good. For example, if one selects say, M=I, or M is random orthogonal, one does not tend to change the relative clustering of the expansion coefficients in the transform domain, so one actually would expect little advantage of treating the $\hat{A}_{:,:,i}$ differently, and would expect little advantage over truncation using a fixed k.

The value of the theorem is that we now can compare the theoretical results from HOSVD to the truncation methods. First, note that the t-ranks of Q and $W \star_M P$ are $k_1$ and $k_2$ respectively. Since C is $k_1 \times k_2 \times n$, its t-rank cannot exceed κ:=min($k_1$, $k_2$). As such, one knows $\mathcal{A}_{appx}$ can be written as a sum of K outer-products of tensors under $\star_M$.

Thus, (14) $\|A \square A_\kappa\|F \|A - A_k\|_F$ with equality only if $\mathcal{A}_k = \mathcal{A}_\kappa$.

As for the multi rank, we know that $\rho_t = 0$ for $t = k_3 + 1$: n, but can show $\rho_i = $rank $(\hat{A}_{:,:,i})$ min $(k_1, k_2)$.

For multi-sided tensor compression, the definition of the $\star_M$ product is tied to the orientation. In other words, given $A \in \mathbb{C}^{m \times p \times n}$, A is viewed as an m×p matrix, with tube-fiber entries of length n. The elemental operation is the $\star_M$ operation on the tube-fibers which are then length n, and so $\star_M$ must be length n. When a data element $D_i$ is viewed as an m×n matrix, and placed into the tensor A as a lateral slice, the resulting tensor would have fibers of length n. However, in some applications, such as if the data represents discrete solutions to PDEs on a 2D grid, there may be no reason to prefer one spatial ordering over another. So, one could treat each data as the n×m matrix obtained from transposing $D_i$. However, inserting D, as the lateral slices instead of $D_i$ will result in a tensor of size n×p×m, and hence the elemental operation over which work will be different, if m≠n. In other words, one needs a new, m×m, M, to define the operator.

To do so, consider the mapping $\mathbb{C}^{m \times p \times n} \to \mathbb{C}^{n \times p \times m}$ induced by matrix-transposing (without conjugation) each of the p lateral slices. In Matlab, this would be obtained by using the command permute($\mathcal{A}$, , [3, 2, 1]). To keep the notation succinct, the invention uses a superscript of P to denote a tensor that has been permuted in this way. Thereby:

$A = $permute$(A, [3,2,1]), (A^P)^P = A$.

In particular, one notes the following relationships useful in later proofs:

$A_{(3)} = [sq(A_{:,1,:})^T, sq(A_{:,2,:})^T, \ldots sq(A_{:,p,:})^T]$; while $(A^P)_{(3)} = [sq(A_{:,1,:}), sq(A_{:,2,:}), \ldots, sq(A_{:,p,:})]$.

Thus, new techniques have been defined for compression that involve both possible orientations of the lateral slices in order to ensure a balanced approach to the compression of the data. But then, one needs a way of denoting under which operator the invention is working at any given time. $\star_M$ is used for a product defined by n×n invertible M, and $\star_B$ for a product defined by m×m invertible B, to keep all the notation clear.

For an optimal convex combination, the first option that is considered is optimal t-SVD compression over both orientations. One finds the tSVD's of both $\mathcal{A}, \mathcal{A}^P, \mathcal{A} \; \mathcal{U} \star_M S \star_M V^T$ and A P=W$\star_B$ D $\star_B Q^T$, compress each, and form $\alpha(U_{k_1} \star_M S_{k_1} \star_M V_{k_1}^T)+(1-\text{Reject})$ Reject($W_{k_2} \star_R D_{k_2} \star_3 Q_{k_2}^T)^P$ Observe that unfold(A P)=PA where A=unfold(A) as before, and P denotes a stride permutation matrix. Of course since P is orthogonal, this means that the singular values and right singular vectors of A are the same as those of PA, and the left singular vectors are row permuted by P. Thus, from our theorem, for a truncation parameter r, $\|A^P-(A^P)_r\|_F \|A-A_r\|_F$.

It follows that $$\|A - (\alpha A_{k_1} + (1-\alpha)(A_{k_2}^P)^P)\| \; \|\alpha(A-A_{k_1}) + (1-\alpha)(A-(A_{k_2}^P)^P)\|_F$$

$$\alpha\|A-A_{k_1}\|_F + (1-\alpha)\|A-A_{k_2}\|_F$$

$$\|A-A_{\min(k_1,k_2)}\|_F.$$

Thus, the new approximation must be no worse than the larger of the two-tensor errors. But in fact, one often sees these are smaller than the best of the two. However, the storage, for this approach is about double since one retains two basis sets and two coefficients.

For multi-sided compression, single sweep, suppose $\mathcal{A} = \mathcal{U} \star_M \mathcal{S} \star_M \mathcal{V}^T$ is m×p×n. Here, as earlier, a subscript on the tensor refers to the number of lateral slices of the tensor that are kept. For example, $\mathcal{U}_k$ will denote $\mathcal{U}_{:,1:k,:}$. The new factorization is obtained from the process 4 show in in FIGS. 7 and 9. The approximation to $\mathcal{A}$ is generated via its implicit representation via the triple ($\mathcal{G}, \mathcal{W}_q, \mathcal{U}_k$) and operator pair ($\star_B, \star_M$) at a storage cost of qpk+mkn+kqn. Though never explicitly formed, the approximation is as (14):

$$A_{k,q} := U_k \star_M (W_q \star_B G)^P = U_k \star_M (V_q \star_B W_q^H \star_B (U_k^H \star_M A)^P)^P. \quad (14)$$

In addition, since the compressed representations are optimal at each stage under their respective algebraic settings, one can show the resulting approximation is optimal in the following sense of theorem 22:

Theorem 22. The approximation $A_{k,q}$ in (14) above is the best approximation that can be expressed in the form $$\sum_{i=1}^{l} U_{:,i,:} *_M q \left( \sum_{j=1}^{k} X_{:,j,:} *_B H_{j,:,:} \right)^P$$

in the Frobenius norm, where the lateral slices $U_{:,i,:}$ are from the the t□SVDM of A and X, H denote any n×q×k and q×p×k tensors, respectively. The error given as $$\|A-A_{k,q}\|_F^2 = \|D_{q+1:p,q+1:p,1}\|_F^2 + \|S_{k+1:p,k+1:p,1}\|_F^2.$$

Figure 8:
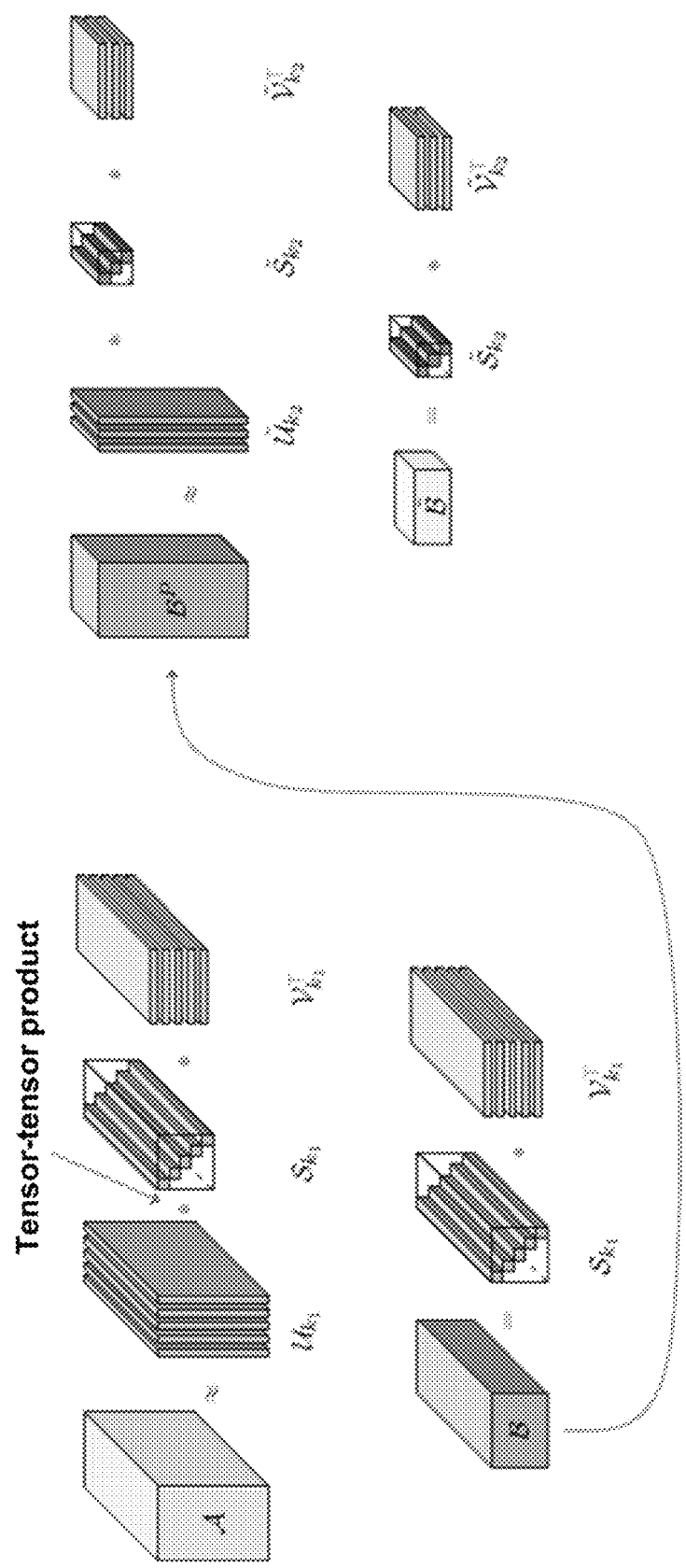
FIG. 8 exemplarily depicts an impact of multi-sided t-SVDM compression fourth process according to an embodiment of the present invention.

FIG. 8 illustrates the impact of the process 4 of FIG. 7.

For multi-sided compression, double sweep, one can combine the results of the above to obtain a compression approach of process 5 of FIGS. 10 and 11 which does not favor which orientation is treated first by sweeping over both orientations of the data with the multisided process and combining the results. The storage for the implicit representation is 2kqp+2mnk+(n+m)kq. Of course, modifications can be made to use different truncation pairs on for each sub-problem, though that begs the question of how such determinations will be made. One can, however, specify truncations that preserve energy to a pre-determined tolerance with the t-SVDMII, so one considers now how to modify that approach for two sides.

For multi-sided compression using t-SVDMII and with general reference to FIGS. 12-14, once one has decided on the specific compression approach in one orientation, one can combine information from multiple orientations to get information less dependent on orientation. Specifically, if one chooses to use the t-SVDMII, one has 3 options:

1. Find A $\rho$ and (A P)$_q$ for two multi□indicies p$\in \mathbb{R}^n$ and q$\in \mathbb{R}^m$, , and form their convex combination. This requires implicit storage of output from Algorithm 3 applied to each orientation.

2. Determine a single□sweep multi□sided analogue to Algorithm 4 but based on t□SVDMII. This also requires two multi□indicies, but the second is length r=max$_i \rho_i$.

3. Determine the double□sweep variant of the above.

Option two warrants more discussion since to retain storage efficiency we want to retain only the transform domain components at each step. From t-SVDMII applied to A, we have retained only the pairs of matrices $\hat{U}_{:,1:\rho_i,i}$ and $\hat{C}_{1:\rho_i,:,i}$ for i=1, . . . , n. However, to describe the approach in the context of Algorithm 4, consider the explicitly zero□padding the coefficients to obtain a $\check{C}$ that is r×p×n, with r=max$_i \rho_i$. In other words, the jth frontal slice of $\check{C}$ will now have r–$\rho_j$ rows of zeros. To perform step 3 of Algorithm 4, one needs to be able to compute a t□SVDM under $\star_B$ applied to $\check{C}$×3M$^{-1}$.

First, the $\underline{C}:=\check{C}$×3M$^{-1}$=fold ((M$^{-1}$⊕I)unfold($\check{C}$)). Next, observe that to move the n×p×r tensor $\underline{C}^P$ into the transform domain by B, one has:

$$(\underline{C}^P) \times 3B = \text{fold}((B \otimes I)\text{unfold}(\underline{C}^P))$$

$$= \text{fold}((B \otimes I)P^T P \text{unfold}(\underline{C}^P))$$

$$= \text{fold}((B \otimes I)P^T \text{unfold}(\underline{C}))$$

$$= \text{fold}((B \otimes I)P^T (M^{-1} \otimes I)\text{unfold}(\check{C}))$$

where P is a stride permutation. Now unfold ($\check{C}$)) can have many rows of zeros, which one does not need to store explicitly to be able to compute the product in the last line above. As each of the r, n×p frontal slices of this tensor are computed, their independent matrix SVDs can be computed (asynchronously). Suppose the j$^{th}$ matrix SVD is $\hat{W}_{:,:,j} \hat{D}_{:,:,j} \hat{Q}_{:,:,j}$, j=1, . . . r.

One needs to keep all the n×q$_j$ matrices $\hat{W}_{:,1:q_j,j}$ (noting that some of the q$_j$ could be 0), as well as the m×$\hat{\rho}_i$ $\hat{U}_{:,1:\rho_i,i}$, for applications in which the 'basis' terms are needed (eg. classification), and in applications where the fully compressed data is required, we need the terms $\hat{G}_{1:q_j,:,j}:=\hat{D}_{1:q_j,1:q_j,j} \hat{Q}_{1:q_j,:,j}$, j=1, . . . , r as well.

Consider how this might be used in practice for, say, recognition. A new piece of data, $\vec{J}$, is observed. Determine the i=1:n subvectors of coefficients of size $\rho_i$:$\hat{U}_{:,1:\rho_i,i}\hat{J}_{:,:,i}$H→. Mathematically, we can describe the remainder of the process as: Pad each of these by r−ρ_t zeros, stack the resulting length r subvectors into a vector v, and compute $$\text{fold}(\{\hat{W}_{:,1:q_1,1}{}^H | \hat{W}_{:,1:q_k,k}{}^H\}(B\oplus I)P^T(M^{-1}\oplus I)v).$$

The above is shown in detail in FIG. 14. This coefficient tensor can be compared against entries in $\hat{G}_{1:q_j,j,:}$ to determine 626 whether the test data resembles the training data. In other words, it is not necessary 627 to work in the spatial domain in our applications, and this is what makes the method 628 powerful.

Figure 17:
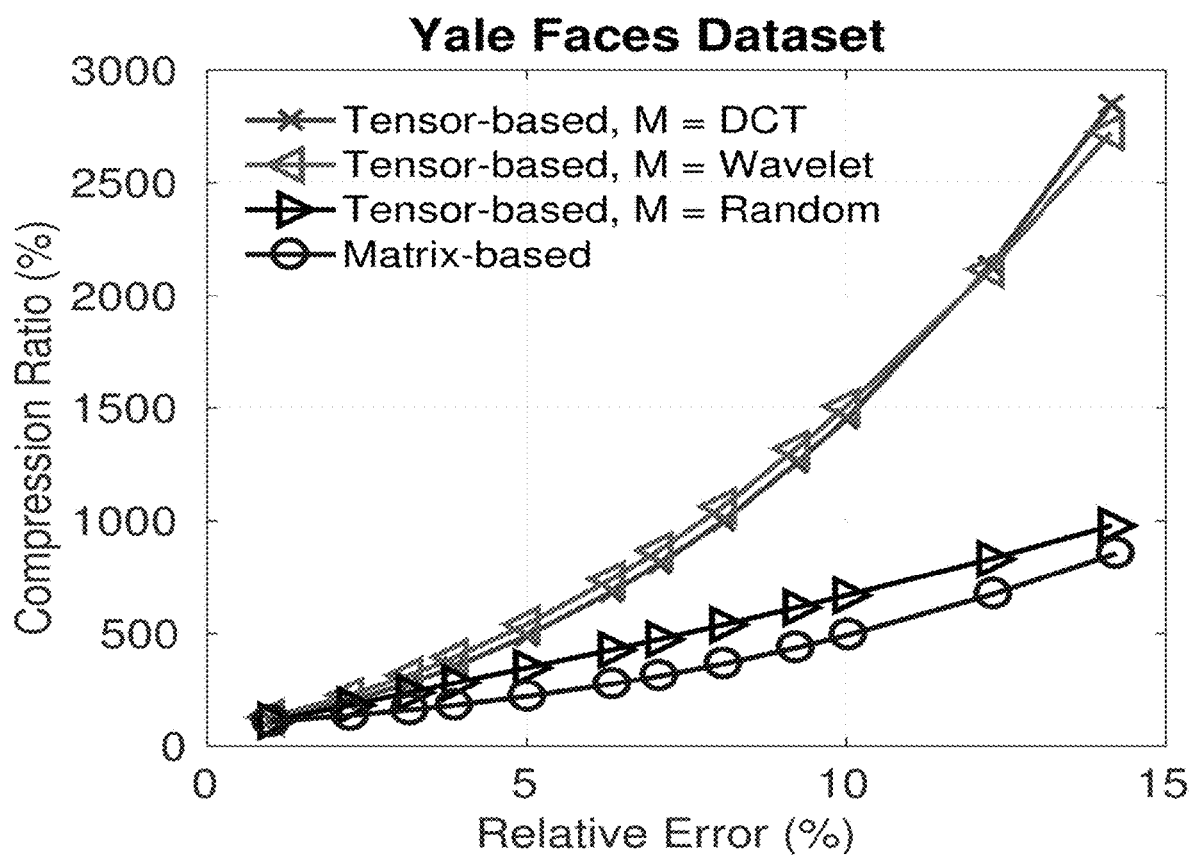
FIG. 17 exemplarily depicts results according to an embodiment of the present invention.

For numerical examples, using compression of YaleB data as an example, the power of compression can be shown for the t-SVDMII approach with appropriate choice of M: that is, M exploits structure inherent in the data. One creates a third order tensor from the Extended Yale B face database by putting the training images in as lateral slices in the tensor. Then, one applies Process 3, varying p, for three different choices of M: one chooses M as a random orthogonal matrix, one uses M as an orthogonal wavelet matrix, and one uses M as the unnormalized DCT matrix. In FIG. 17, one plots the compression ratio against the relative error in the approximation. It is observed that for relative error on the order of 10 to 15 percent, the margins in compression achieved by the t-SVDMII for both the DCT and the Wavelet transform vs. treating the data in either matrix form, or in choosing a transform that—like the matrix case—does not exploit structure in the data, is quite large.

For extension to 4-dimensions and higher, although the process were described for third order tensors, the process approach can be extended to higher order tensors since the definitions of the tensor-tensor products extend to higher order tensors in a recursive fashion. A similar recursive construct can be used for higher order tensors for the $\star_M$ product, or different combinations of transform based products can be used along different modes.

With reference to FIG. 1, in step 101, multi-dimensional data is compressed by truncated tensor-tensor decompositions.

The multi-dimensional data is represented in a native tensor structure. Thereby, in situations where the degree of the tensor is 2, the approach will act similarly as matrix-based data compression. The compressing is further constrained by user-defined parameters (e.g., compression properties of the compressing the multi-dimensional data are user-defined parameters) such as compression ratio, truncation indices, bounds on compression integrity, etc. The truncation of the decomposition is performed per the user-defined parameters.

In step 102, for a tensor degree n where n is an integer, performing n−1 truncated tensor-tensor singular value decompositions and/or QR decompositions per tensor permutation. The tensor-tensor singular value decompositions are performed with a predefined tensor-tensor product procedure.

In step 103, a compact approximated representation of an original input tensor from the native tensor structure is output per user-defined compression parameters.

Figure 15:
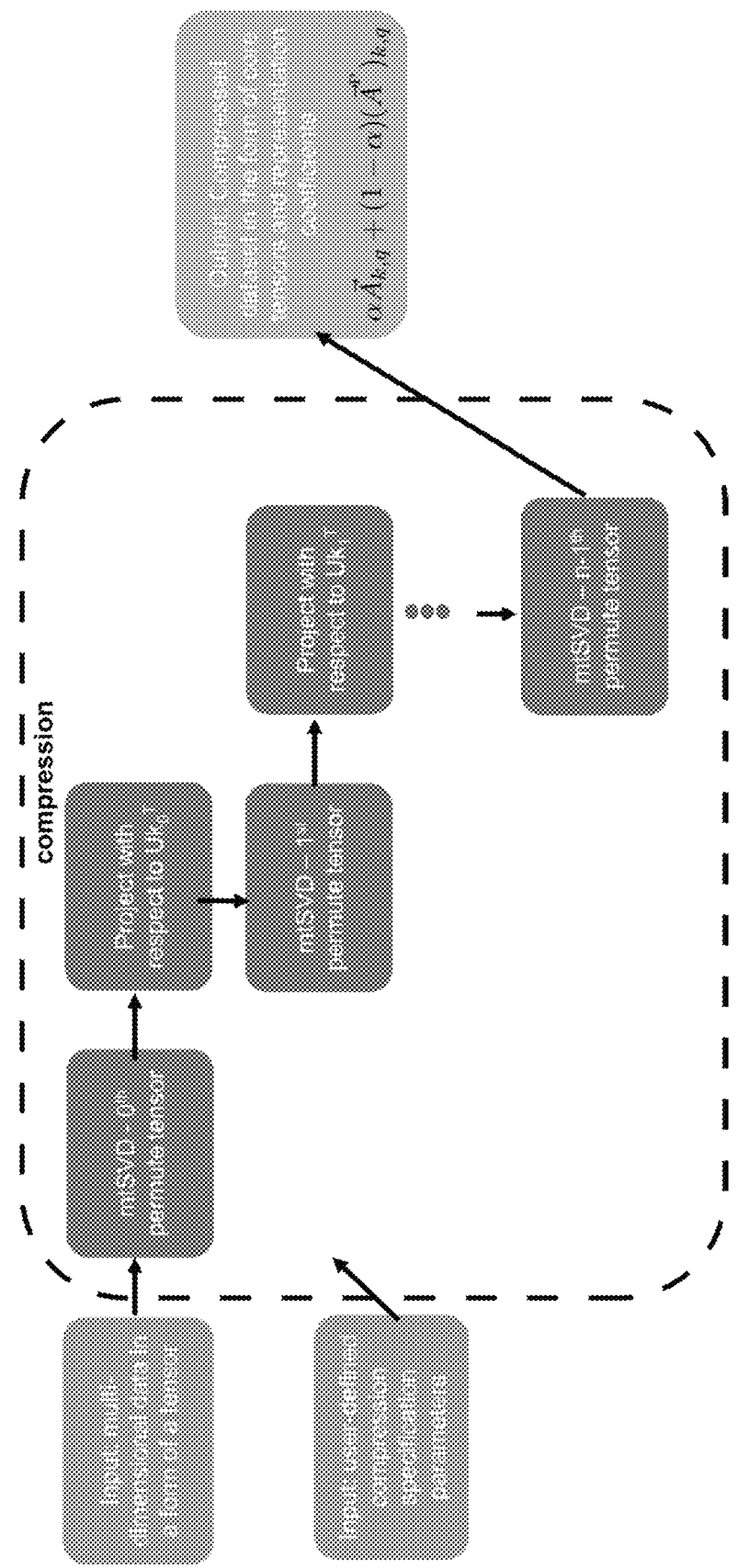
FIG. 15 exemplarily depicts a system level view 200 according to an embodiment of the present invention.
Figure 16:
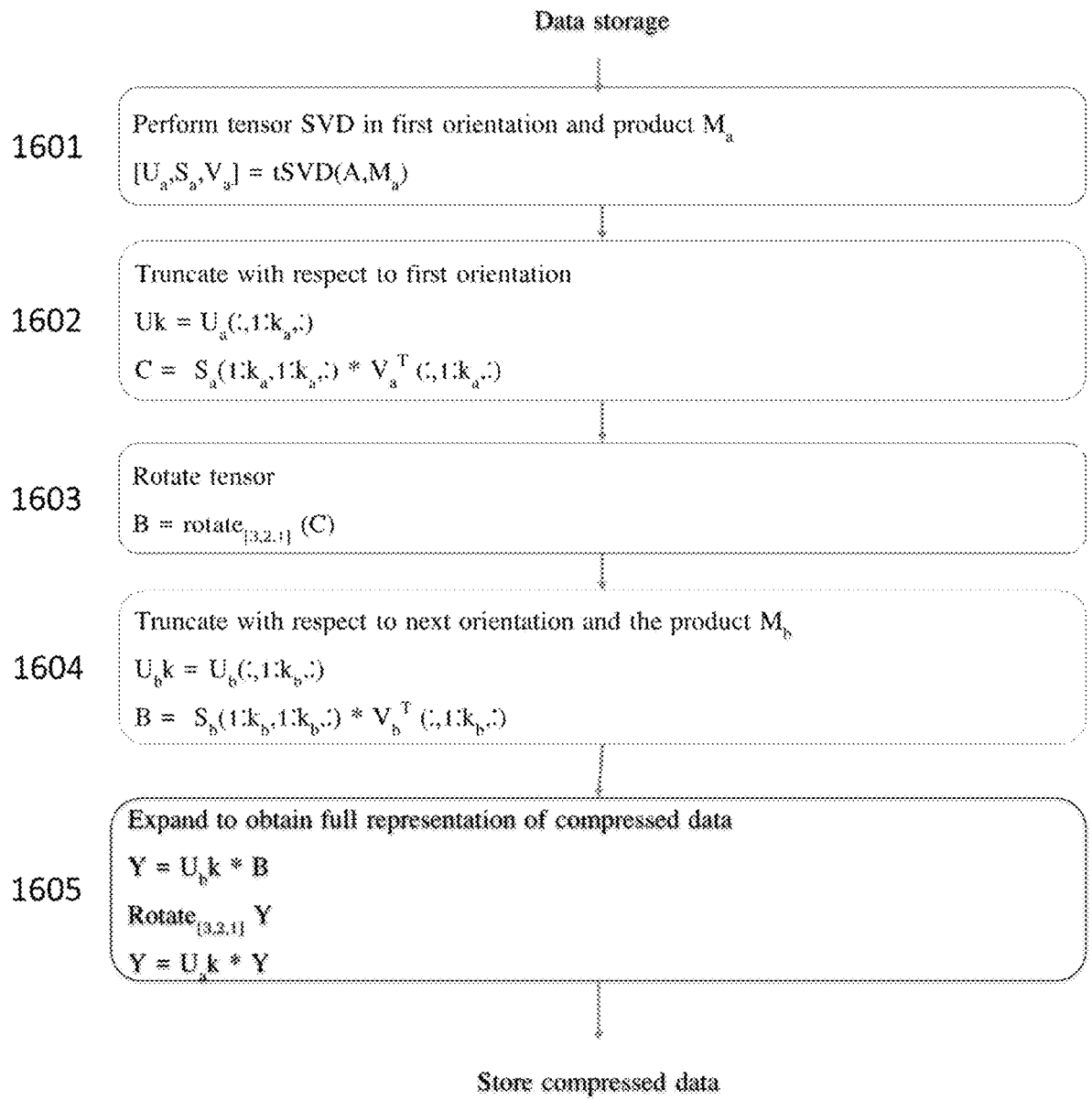
FIG. 16 exemplarily depicts a flow chart of a method 1600 according to an embodiment of the present invention.

In other words, tensor data is input into the method 100, a Tensor Singular Value Decomposition (TSVD) over M product of the data is computed, a first index is found, and a component corresponding to the first index is determined. Indeed, FIGS. 15-16 depict a high-level system 200 overview and method 1600 flow for the system 200.

Exemplary Aspects, Using a Cloud Computing Environment

Although this detailed description includes an exemplary embodiment of the present invention in a cloud computing environment, it is to be understood that implementation of the teachings recited herein are not limited to such a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client circuits through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 18, a schematic of an example of a cloud computing node is shown. Cloud computing node 10 is only one example of a suitable node and is not intended to suggest any limitation as to the scope of use or functionality of embodiments of the invention described herein. Regardless, cloud computing node 10 is capable of being implemented and/or performing any of the functionality set forth herein.

Although cloud computing node 10 is depicted as a computer system/server 12, it is understood to be operational with numerous other general or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop circuits, multiprocessor systems, microprocessor-based systems, set top boxes, programmable consumer electronics, network PCs, minicomputer systems, mainframe computer systems, and distributed cloud computing environments that include any of the above systems or circuits, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing circuits that are linked through a communications network. In a distributed cloud computing environment, program modules may be located in both local and remote computer system storage media including memory storage circuits.

Referring now to FIG. 18, a computer system/server 12 is shown in the form of a general-purpose computing circuit. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further described below, memory 28 may include a computer program product storing one or program modules 42 comprising computer readable instructions configured to carry out one or more features of the present invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may be adapted for implementation in a networking environment. In some embodiments, program modules 42 are adapted to generally carry out one or more functions and/or methodologies of the present invention.

Computer system/server 12 may also communicate with one or more external devices 14 such as a keyboard, a pointing circuit, other peripherals, such as display 24, etc., and one or more components that facilitate interaction with computer system/server 12. Such communication can occur via Input/Output (I/O) interface 22, and/or any circuits (e.g., network card, modem, etc.) that enable computer system/server 12 to communicate with one or more other computing circuits. For example, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18.

It should be understood that although not shown, other hardware and/or software components could be used in conjunction with computer system/server 12. Examples, include, but are not limited to: microcode, circuit drivers, redundant processing units, external disk drive arrays, RAID systems, tape drives, and data archival storage systems, etc.

Figure 19:
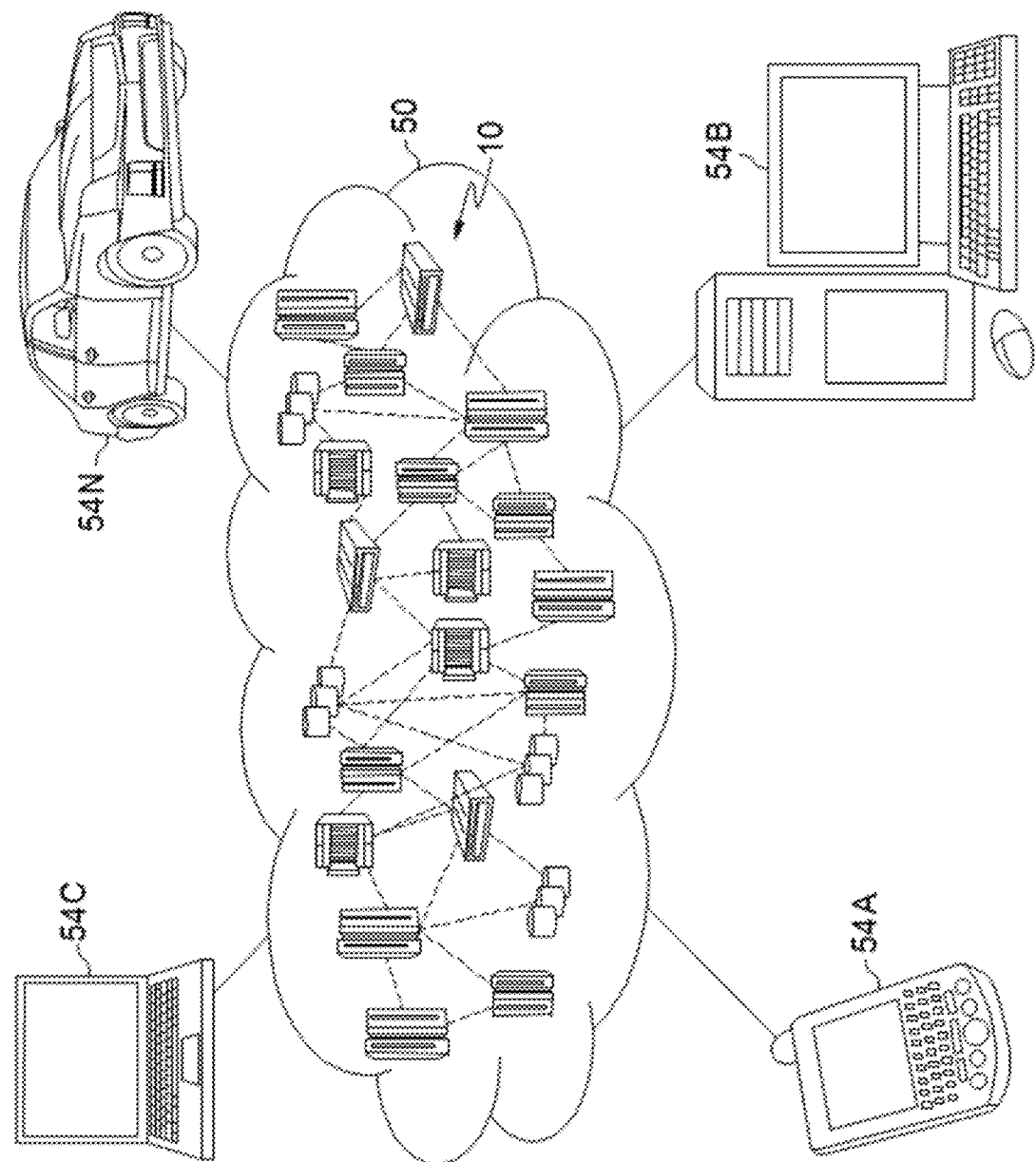
FIG. 19 depicts a cloud-computing environment 50 according to an embodiment of the present invention.

Referring now to FIG. 19, illustrative cloud computing environment 50 is depicted. As shown, cloud computing environment 50 comprises one or more cloud computing nodes 10 with which local computing circuits used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing circuit. It is understood that the types of computing circuits 54A-N shown in FIG. 19 are intended to be illustrative only and that computing nodes 10 and cloud computing environment 50 can communicate with any type of computerized circuit over any type of network and/or network addressable connection (e.g., using a web browser).

Figure 20:
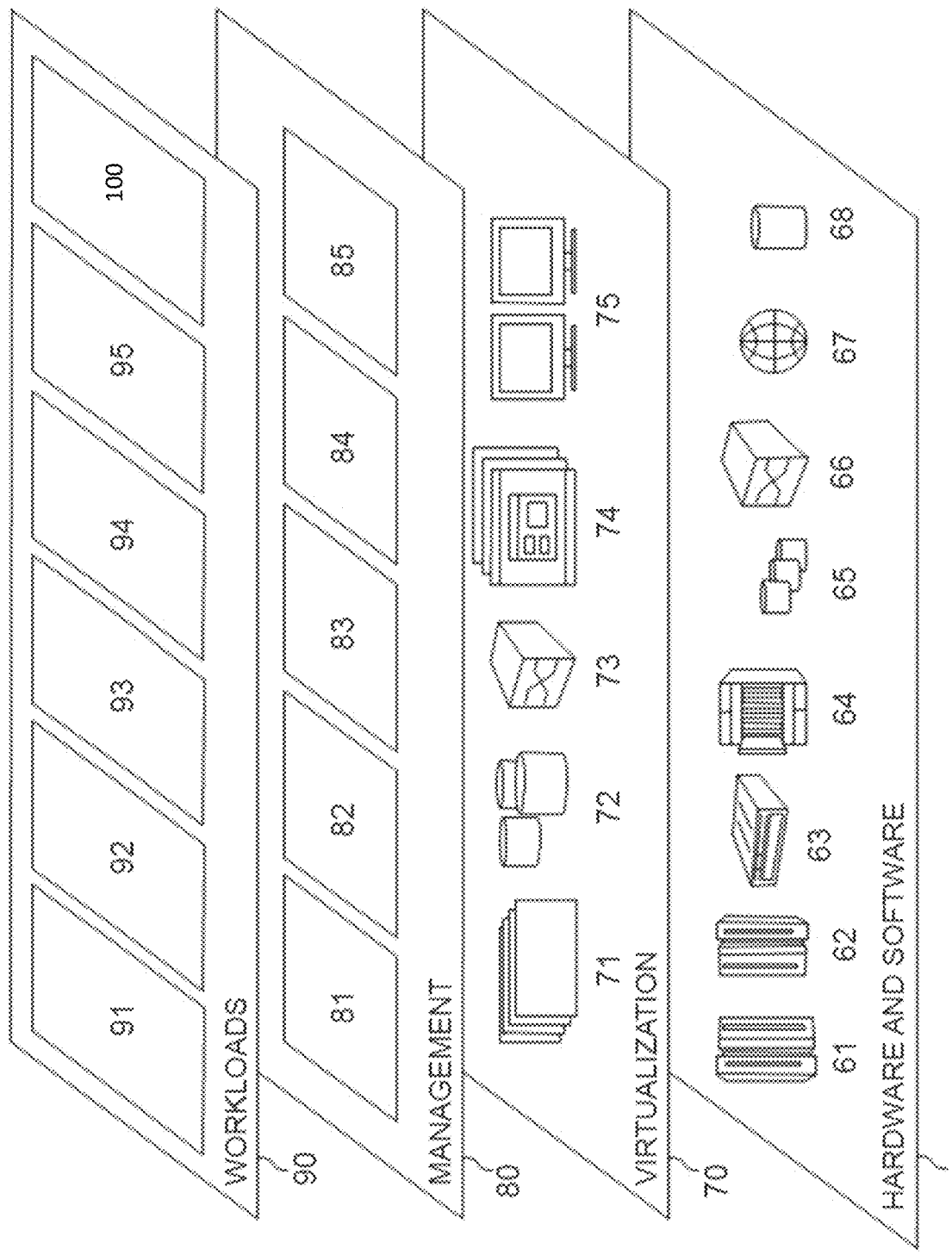
FIG. 20 depicts abstraction model layers according to an embodiment of the present invention.

Referring now to FIG. 20, an exemplary set of functional abstraction layers provided by cloud computing environment 50 (FIG. 19) is shown. It should be understood in advance that the components, layers, and functions shown in FIG. 20 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage circuits 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and tensor decomposition method 100 in accordance with the present invention.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Further, Applicant's intent is to encompass the equivalents of all claim elements, and no amendment to any claim of the present application should be construed as a disclaimer of any interest in or right to an equivalent of any element or feature of the amended claim.

What is claimed is:

1. A computer-implemented tensor decomposition method, the method comprising:
compressing multi-dimensional data by truncated tensor-tensor decompositions,
wherein the compressing is performed with respect to at least two orientations of the multi-dimensional data,
wherein the compressing is performed via a double sweep by sweeping over the two orientations with a multi-sided process and combining a result of the sweeping, and
wherein the result of the sweeping as the compressing is less dependent on orientation than a result of the compressing.

2. The method of claim 1, wherein the multi-dimensional data is represented in a native tensor structure.

3. The method of claim 2, further comprising, for a tensor degree n where n is an integer, performing up to n−1 truncated tensor-tensor singular value decompositions.

4. The method of claim 2, further comprising, for a tensor degree n where n is an integer, performing QR decompositions per tensor permutation.

5. The method of claim 4, wherein the QR decompositions are performed with a predefined tensor-tensor product procedure.

6. The method of claim 3, wherein the tensor-tensor singular value decompositions are performed with a predefined tensor-tensor product procedure.

7. The method of claim 5, wherein the tensor-tensor singular value decompositions are performed with a predefined tensor-tensor product procedure.

8. The method of claim 1, wherein compression properties of the compressing the multi-dimensional data are user-defined parameters.

9. The method of claim 8, wherein truncation of the decompositions is performed per the user-defined parameters.

10. The method of claim 2, further comprising outputting a compact approximated representation of an original input tensor from the native tensor structure per user-defined compression parameters.

11. The method of claim 1, embodied in a cloud-computing environment.

12. A computer program product for tensor decomposition, the computer program product comprising a non-transitory computer-readable storage medium having program instructions embodied therewith, the program instructions executable by a computer to cause the computer to perform:
compressing multi-dimensional data by truncated tensor-tensor decompositions,
wherein the compressing is performed with respect to at least two orientations of the multi-dimensional data,
wherein the compressing is performed via a double sweep by sweeping over the two orientations with a multi-sided process and combining a result of the sweeping, and
wherein the result of the sweeping as the compressing is less dependent on orientation than a result of the compressing.

13. The computer program product of claim 12, wherein the multi-dimensional data is represented in a native tensor structure.

14. The computer program product of claim 13, further comprising, for a tensor degree n where n is an integer, performing up to n−1 truncated tensor-tensor singular value decompositions.

15. The computer program product of claim 13, further comprising, for a tensor degree n where n is an integer, performing QR decompositions per tensor permutation.

16. The computer program product of claim 15, wherein the QR decompositions are performed with a predefined tensor-tensor product procedure.

17. The computer program product of claim 14, wherein the tensor-tensor singular value decompositions are performed with a predefined tensor-tensor product procedure.

18. The computer program product of claim 16, wherein the tensor-tensor singular value decompositions are performed with a predefined tensor-tensor product procedure.

19. A tensor decomposition system, the system comprising:
a processor; and
a memory, the memory storing instructions to cause the processor to perform:
compressing multi-dimensional data by truncated tensor-tensor decompositions,
wherein the compressing is performed with respect to at least two orientations of the multi-dimensional data,
wherein the compressing is performed via a double sweep by sweeping over the two orientations with a multi-sided process and combining a result of the sweeping, and
wherein the result of the sweeping as the compressing is less dependent on orientation than a result of the compressing.

20. The system of claim 19, embodied in a cloud-computing environment.

* * * * *